United States Patent
Herrmann (10) Patent No.: US 10,629,571 B2
(45) Date of Patent: Apr. 21, 2020

(54) OPTOELECTRONIC SEMICONDUCTOR COMPONENT

(71) Applicant: OSRAM OLED GmbH, Regensburg (DE)

(72) Inventor: Siegfried Herrmann, Neukirchen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/071,253

(22) PCT Filed: Mar. 2, 2017

(86) PCT No.: PCT/EP2017/054893
§ 371 (c)(1),
(2) Date: Jul. 19, 2018

(87) PCT Pub. No.: WO2017/153244
PCT Pub. Date: Sep. 14, 2017

(65) Prior Publication Data
US 2019/0214375 A1     Jul. 11, 2019

(30) Foreign Application Priority Data
Mar. 8, 2016 (DE) .................. 10 2016 104 202

(51) Int. Cl.
*H01L 25/075* (2006.01)
*H01L 33/46* (2010.01)
(Continued)

(52) U.S. Cl.
CPC ...... *H01L 25/0756* (2013.01); *H01L 25/0753* (2013.01); *H01L 33/46* (2013.01);
(Continued)

(58) Field of Classification Search
CPC .................................................. H01L 33/486
See application file for complete search history.

(56) References Cited

U.S. PATENT DOCUMENTS

| 2006/0220046 A1 | 10/2006 | Yu et al. |
| 2006/0243986 A1 | 11/2006 | Wall, Jr. |

(Continued)

FOREIGN PATENT DOCUMENTS

| DE | 102013201952 A1 | 8/2014 |
| DE | 102015104886 A1 | 10/2016 |

(Continued)

*Primary Examiner* — Yu-Hsi D Sun
(74) *Attorney, Agent, or Firm* — Slater Matsil, LLP (57) ABSTRACT

An optoelectronic semiconductor component is disclosed. In an embodiment a component includes a housing having a recess, a first semiconductor chip for generating light of a first color and a second semiconductor chip for generating light of a second color which is different from the first color, wherein, during operation, a mixed radiation including at least the light of the first color is emitted along a main emission direction, wherein the first semiconductor chip is arranged in a first plane and the second semiconductor chip is arranged in a second plane in the recess, the planes following one another along the main emission direction, wherein active zones of the first and second semiconductor chips are arranged side by side to one another, and wherein at least one electrical connection surface of the first semiconductor chip forms a part of a mounting surface of the semiconductor component.

15 Claims, 8 Drawing Sheets

(51) Int. Cl.
*H01L 33/48* (2010.01)
*H01L 33/60* (2010.01)
*H01L 33/62* (2010.01)

(52) U.S. Cl.
CPC ............ *H01L 33/486* (2013.01); *H01L 33/60* (2013.01); *H01L 33/62* (2013.01); *H01L 2933/0091* (2013.01)

(56) References Cited

U.S. PATENT DOCUMENTS

| | | |
|---|---|---|
| 2006/0245188 A1 | 11/2006 | Takenaka |
| 2009/0001392 A1 | 1/2009 | Lee |
| 2010/0231824 A1 | 9/2010 | Nakata et al. |
| 2011/0062464 A1 | 3/2011 | Gerhard |
| 2011/0198649 A1* | 8/2011 | Yamada ................ H01L 33/486 257/98 |
| 2013/0200408 A1 | 8/2013 | Wang |
| 2018/0102466 A1 | 4/2018 | Herrmann |
| 2018/0114887 A1 | 4/2018 | Herrmann et al. |

FOREIGN PATENT DOCUMENTS

| | | |
|---|---|---|
| DE | 102015107590 A1 | 11/2016 |
| EP | 2626900 A2 | 8/2013 |
| JP | 2000244020 A | 9/2000 |

* cited by examiner

OPTOELECTRONIC SEMICONDUCTOR COMPONENT

This patent application is a national phase filing under section 371 of PCT/EP2017/054893, filed Mar. 2, 2017, which claims the priority of German patent application 10 2016 104 202.1, filed Mar. 8, 2016, each of which is incorporated herein by reference in its entirety.

TECHNICAL FIELD

The invention relates to an optoelectronic semiconductor component.

SUMMARY OF THE INVENTION

Embodiments provide a space-saving optoelectronic semiconductor component which emits differently colored light in a variable manner.

According to at least one embodiment, the semiconductor component comprises a housing. Preferably, the housing is that component of the semiconductor component which mechanically carries it and mechanically supports it. The housing is preferably rigid so that the semiconductor component does not deform during intended use. The housing can provide protection against external mechanical and/or chemical influences such as contamination.

According to at least one embodiment, the housing comprises a recess, in particular exactly one continuous recess. Preferably, the recess is surrounded on side faces all around by a material of the housing.

According to at least one embodiment, the semiconductor component has one or more first semiconductor chips. The at least one first semiconductor chip is designed to generate light of a first color.

According to at least one embodiment, the semiconductor component also has one or more second semiconductor chips. The at least one second semiconductor chip is designed to generate light of a second color. The second color is different from the first color.

The semiconductor chips are preferably light-emitting diode chips, LED chips for short. The terms first color and second color can refer to substantially monochromatic, single-colored light or also mixed-colored light such as white light. In addition to the light-emitting semiconductor chips, preferably no further active components are accommodated in the housing and/or in the semiconductor component. In particular, the semiconductor component can be free of chips for addressing or driving the light-generating semiconductor chips. This does not exclude that an element for protecting against damage caused by electrostatic discharges is accommodated in the semiconductor component.

According to at least one embodiment, the semiconductor component emits mixed radiation during operation. The mixed radiation is emitted in particular in a main emission direction. The main emission direction is that direction along which the highest power, in particular measured in mW, is emitted. The mixed radiation comprises at least light of the first color and/or of the second color. The mixed radiation preferably comprises both light of the first color and light of the second color and optionally further light, which is generated, for example, by means of a phosphor, for example, from light of the second color.

According to at least one embodiment, the first semiconductor chip or chips is/are arranged in a first plane. Correspondingly, the second semiconductor chip or chips can be arranged in a second plane. In this case, the planes follow one another along the main emission direction. In the first plane, there are only the first semiconductor chips and not the second semiconductor chips, and the same applies to the second plane. Along the main radiation direction, the second plane preferably follows the first plane. The two planes can be arranged parallel or substantially parallel to one another and preferably do not intersect within the semiconductor component.

According to at least one embodiment, the first semiconductor chip and the second semiconductor chip are arranged in the recess. In particular, all the semiconductor chips are completely located within the recess and thus preferably do not project beyond the housing.

According to at least one embodiment, the semiconductor chips which are provided for generating light in each case comprise an active zone, in particular exactly one active zone. The active zone is formed, for example, by one or more semiconductor layers of the associated semiconductor chips. In particular, the generation of the light takes place in the active zones on account of a charge carrier recombination.

According to at least one embodiment, seen in a plan view, that is in the direction parallel to the main emission direction, the active zones of the semiconductor chips are arranged side by side to one another. This can mean that the active zones do not overlap when viewed in a plan view.

According to at least one embodiment, the semiconductor chips are arranged in the recess in a dense manner. In other words, the recess, when viewed in plan view, is filled up to a considerable extent by the semiconductor chips. For example, seen in a plan view, the recess is filled up to at least 20% or 40% or 60% or 80% or completely by the semiconductor chips. As a result, a compact optoelectronic semiconductor component having a high luminance and having small lateral dimensions can be achieved.

In at least one embodiment, the optoelectronic semiconductor component comprises a housing having a recess and at least one first semiconductor chip for generating light of a first color and at least one second semiconductor chip for generating light of a second color, wherein the second color is different from the first color. During operation, a mixed radiation comprising at least light of the first color is emitted along a main emission direction. The first semiconductor chip is arranged in a first plane and the second semiconductor chip is arranged in a second plane in the recess, wherein the two planes follow one another along the main radiation direction. In a plan view parallel to the main emission direction, active zones of the semiconductor chips are arranged side by side to one another. The recess is filled with the semiconductor chips to at least 20% or 80%, as seen in plan view.

Light emitting diodes emitting different colors often have a plurality of light emitting diode chips emitting different colors, for example, red, green and blue light-emitting diode chips, in order to realize a so-called RGB LED. In such components, the semiconductor chips are usually arranged laterally next to one another in a common plane at comparatively large distances. As a result, a comparatively large amount of space is required. Alternatively, the light-emitting diode chips can be arranged stacked one on top of the other, wherein the light-emitting diode chips are normally oriented parallel to one another. In this case, comparatively large losses occur due to absorption within the light-emitting diode chips.

In the optoelectronic semiconductor component described here, a multifunctional base body having a central recess is present. The recess preferably has step-shaped extensions, in which the semiconductor chips are arranged such that the active zones do not overlap when viewed in a plan view. However, the light-emitting semiconductor chips can overlap one another in this case. By means of such an arrangement, a space saving is realized and losses due to mutual absorption of light generated by the various semiconductor chips is minimized, so that a high efficiency can be achieved.

According to at least one embodiment, a main emission direction of the at least one first semiconductor chip is oriented parallel or approximately parallel to the main emission direction of the semiconductor component. This can also apply to a main emission direction of the at least one second semiconductor chip. Approximately means, for example, with a tolerance of at most 15° or 10° or 5°.

According to at least one embodiment, the main emission direction of the at least one second semiconductor chip is transverse, in particular perpendicularly or approximately perpendicularly, to the main radiation direction of the semiconductor component. In other words, the first and the second semiconductor chips can have main emission directions oriented perpendicular to one another.

According to at least one embodiment, the first and the second semiconductor chips do not overlap in projection in the direction perpendicular to the main direction of emission of the semiconductor component. In other words, the semiconductor chips do not overlap with one another in a side view. There is thus a sufficient offset of the first and second semiconductor chips relative to one another along the main emission direction, wherein this offset can correspond to at least a thickness of the semiconductor chips.

According to at least one embodiment, the first and the second semiconductor chips partially overlap, viewed in plan view and in the direction parallel to the main emission direction of the semiconductor component. In other words, the semiconductor chips are partially stacked one on top of the other. In this case, however, the active zones do not overlap, as seen in plan view.

According to at least one embodiment, a plurality of second semiconductor chips is present. The second semiconductor chips or at least the active zones thereof are arranged on or around the first semiconductor chip, as seen in plan view. In this case, as seen in a plan view, the second semiconductor chips can be located on two or on more than two sides of the first semiconductor chip, for example, on mutually opposite sides or also on adjacent sides.

According to at least one embodiment, the semiconductor chip is arranged centrally in the recess. This can mean that a center point of the first semiconductor chip coincides with a center point of the recess, seen in plan view. In particular, the first semiconductor chip is placed symmetrically in the recess.

According to at least one embodiment, the recess is configured in a stepped manner when viewed in cross section. In this case, the steps are preferably oriented symmetrically with respect to an axis parallel to the main emission direction of the semiconductor component. Flanks of the steps are preferably oriented parallel to the main emission direction and connecting lines between the flanks are perpendicular to the main emission direction. In other words, the recess, as seen in cross section, can appear as a right-angled step arrangement.

According to at least one embodiment, precisely one first and precisely one second semiconductor chip are present. The second semiconductor chip preferably completely covers the first semiconductor chip. Viewed in a plan view, center points of the semiconductor chips can lie one above the other and can also coincide with a center point of the recess.

According to at least one embodiment, the at least one second semiconductor chip comprises a light-transmissive growth substrate, on which the associated semiconductor layer sequence with the corresponding active zone is grown. The growth substrate is transmissive to at least light of the first semiconductor chip. For example, the at least one second semiconductor chip is a so-called sapphire chip in which a semiconductor layer sequence is grown epitaxially on a sapphire substrate, for example, from the material system InAlGaN.

According to at least one embodiment, at least a portion of the light of the first color passes through the growth substrate of the second semiconductor chip in the direction parallel or approximately parallel to the main emission direction. This means that the light of the first color generated in the first semiconductor chip, before leaving the semiconductor component, must partially or completely run through the growth substrate.

According to at least one embodiment, the at least one second semiconductor chip is mounted in the recess such that the associated active zone faces the first plane. In other words, the following sequence can be present along the main emission direction: first semiconductor chip, active zone as well as semiconductor layer sequence of the second semiconductor chip, growth substrate of the second semiconductor chip.

According to at least one embodiment, a light-transmissive, light-scattering filling and/or a light distribution plate and/or a phosphor or a phosphor mixture is/are arranged in the recess. The phosphor or the phosphor mixture can be integrated in the filling and/or in the light distribution plate. It is possible for the recess, together with the light-generating semiconductor chips, to be completely filled by the filling, the light distribution plate and/or the phosphor. Alternatively, it is possible for an air gap to be located in particular between the light distribution plate and the at least one first semiconductor chip.

According to at least one embodiment, at least one mirror is arranged in the recess. The mirror prevents or at least reduces the probability that light of the second color can arrive straight, that is without radiation deflection, at the active zone of the first semiconductor chip. Preferably, the same applies also vice versa, so that, in particular on account of the mirror, no light of the first color travels directly to the active zone of the second semiconductor chip. Corresponding mirrors can be metallic mirrors, for example, with a reflective silver layer or aluminum layer. Similarly, such mirrors can be realized as Bragg mirrors and/or as dielectric mirrors having a sequence of a plurality of layers having different refractive indices.

According to at least one embodiment, at least one side surface of the at least one second semiconductor chip forms a reflector. For example, the side surface or all side surfaces facing in the direction of the first semiconductor chip are mirror-coated. The reflector can be realized, for example, by means of a metallic mirror coating or also by a Bragg mirror. The mirrored side surfaces can be oriented parallel to the main emission direction of the first semiconductor chip.

According to at least one embodiment, the first semiconductor chip has electrical connection surfaces. The electrical connection surfaces are preferably located on a single side of the semiconductor chip so that the first semiconductor chip is designed as a so-called flip-chip. Likewise, the connection surfaces can be located on mutually opposite sides, in particular main sides.

According to at least one embodiment, at least one of or all of the electrical connection areas of the semiconductor chip, in particular of the first semiconductor chip, represents/ represent a part of a mounting surface of the semiconductor component. In this case, the semiconductor component can preferably be surface-mounted via the mounting surface, with regard to at least one or exactly one or with respect to all connection surfaces. That is to say that the optoelectronic semiconductor component can be an SMD component, wherein SMD stands for surface mount device. In other words, it is possible, in particular of the first semiconductor chip, to be directly electrically contacted during assembly of the semiconductor component, without further components of the semiconductor component being involved.

According to at least one embodiment, the housing is produced from a reflecting and/or electrically conductive material. For example, from one or more metals or from an electrically conductive plastic and/or composite material. The housing can likewise be formed from a reflecting plastic together with a lead frame or from a reflective ceramic together with conductor tracks.

According to at least one embodiment, the housing is divided into a plurality of segments which are electrically separated from one another. For example, the segments are formed from a metal or a metallically coated foil, the segments are mechanically connected to one another by means of a connecting means in a parting line between the segments.

According to at least one embodiment, the segments of the housing form part of the mounting surface of the semiconductor component. In particular, the segments are configured on the mounting surface to get mounted to an external carrier, for example, by means of soldering or electrically conductive adhesive bonding.

According to at least one embodiment, electrical connection surfaces of the second semiconductor chip are electrically connected to the segments within the recess. In other words, the second semiconductor chips can be electrically contacted via the segments.

According to at least one embodiment, the at least one first semiconductor chip is a surface emitter. This means that the first semiconductor chip then emits the light of the first color essentially only on one main side. The first semiconductor chip preferably has a Lambertian emission characteristic. The first semiconductor chip is in particular a red, orange or yellow light-emitting semiconductor chip based on AlInGaAs or AlInGaP.

According to at least one embodiment, the at least one second semiconductor chip is a volume emitter. In this case, the second semiconductor chip preferably has a light-transmissive growth substrate which is optically connected to the light-generating active zone. A volume emitter thus has a light emission on a plurality of sides, in particular on all sides. If the second semiconductor chip is designed as a cube or cuboid, thus, in the case of a volume emitter there is a light emission on all six sides of the cuboid or cube.

According to at least one embodiment, the second semiconductor chips are configured as flip chips, in particular like the first semiconductor chips. In this case, all the electrical connection surfaces of all semiconductor chips can point jointly in the same direction. Alternatively, it is possible for the electrical connection surfaces of the at least one first semiconductor chip and of the at least one second semiconductor chip to be oriented perpendicularly or approximately perpendicularly to one another.

According to at least one embodiment, at least the second semiconductor chips or the at least one second semiconductor chip are/is contacted within the recess without bonding wires. For example, the at least one second semiconductor chip is soldered to the segments of the housing and/or adhesively bonded in an electrically conductive manner. Preferably, all the semiconductor chips of the semiconductor component are electrically contacted or contactable without bonding wires.

According to at least one embodiment, the at least one second semiconductor chip has a greater extent in the direction perpendicular to the active zone thereof than in at least one direction parallel to the active zone thereof. In other words, the second semiconductor chip can be thicker than it is wide.

According to at least one embodiment, the at least one first semiconductor chip has lateral dimensions which are greater than the thickness thereof. In other words, the first semiconductor chip is then wider and preferably also longer than thick.

BRIEF DESCRIPTION OF THE DRAWINGS

An optoelectronic semiconductor component described here is explained in more detail below with reference to the drawings on the basis of exemplary embodiments. Identical reference signs indicate the same elements in the individual figures. However, no relationships to scale are illustrated, but rather individual elements can be represented with an exaggerated size in order to afford a better understanding.

In the figures.

DETAILED DESCRIPTION OF ILLUSTRATIVE EMBODIMENTS

Figure 1A:
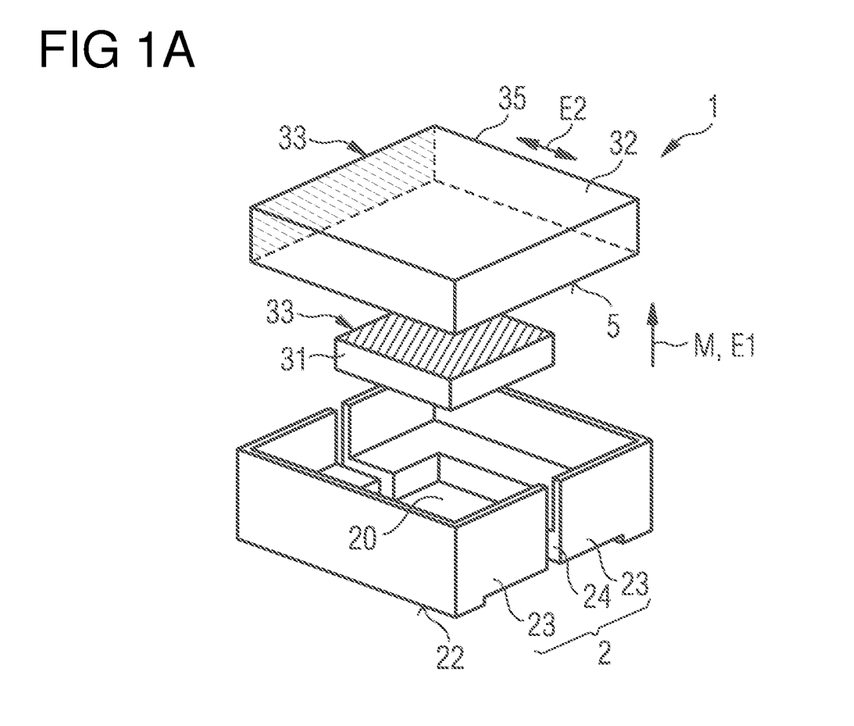
FIGS. 1A to 1G and FIGS. 2A to 2E show schematic exploded views, plan views and perspective representations of exemplary embodiments of optoelectronic semiconductor components.
Figure 1B:
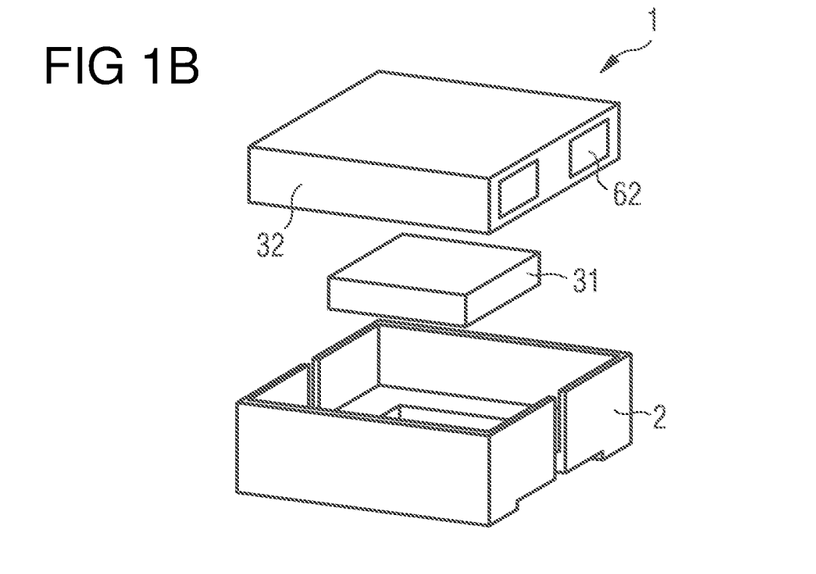
Figure 1C:
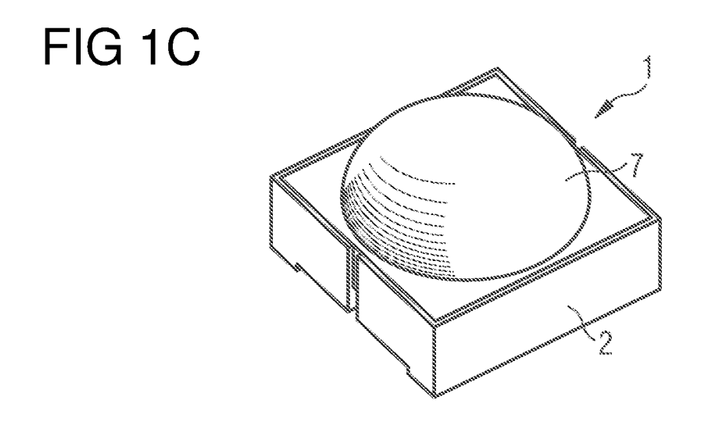
Figure 1D:
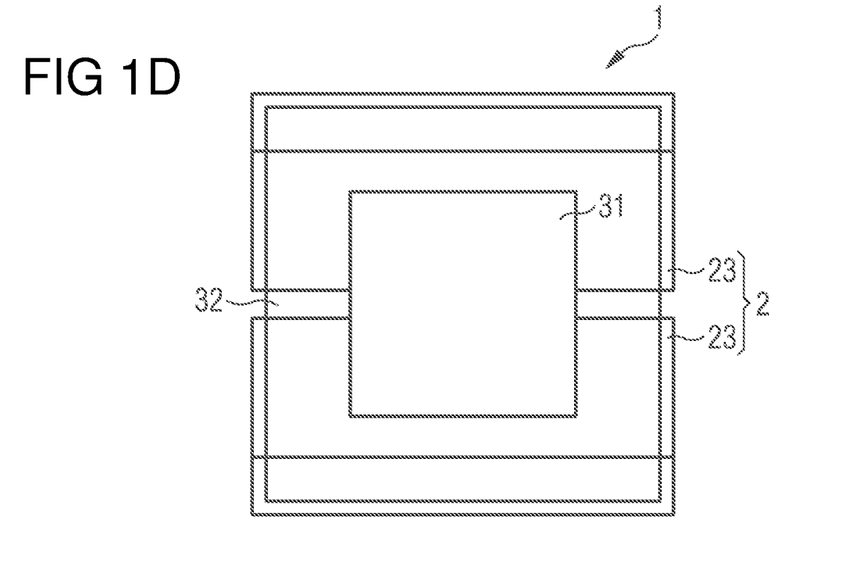

FIG. 1 shows an exemplary embodiment of an optoelectronic semiconductor component 1, see the exploded drawings in FIGS. 1A and 1B, the top view in FIG. 1D and the perspective representations in FIGS. 1C, 1E, 1F and 1G.

The semiconductor component 1 comprises a reflective housing 2. The housing 2 is divided into two segments 23, which are produced from a reflecting and electrically conductive material, for example, of aluminum or an aluminum alloy. The housing 2 has a stepped recess 20, viewed in cross section. In a central region, the recess 20 completely penetrates the housing 2, in the direction parallel to a main emission direction M of the semiconductor component 1. This central region of the recess 20 is arranged centrally in the housing 2, seen in plan view.

The two segments 23 are separated from one another by a parting line 24. Deviating from the illustration in FIG. 1 and, as in all other exemplary embodiments, the parting line 24 is preferably grout with a connecting means, in order to connect the segments 23 in a mechanically secure and electrically insulating manner.

On a mounting surface 22 of the housing 2, it is possible for two rails to be formed. Said rails can extend completely along opposite side surfaces of the housing. Main directions of expansion of these rails are preferably oriented parallel to main directions of expansion of the segments 23. The mounting surface 22 is oriented perpendicularly or approximately perpendicular to the main radiation direction M.

A light-emitting first semiconductor chip 31 is located in the recess 20. For example, the first semiconductor chip 31 is square in plan view. The first semiconductor chip 31 is relatively thin and can be designed as a Lambertian emitter. A first main emission direction E1 of the first semiconductor chip 31 is oriented parallel to the main emission direction M.

Along the main emission direction M, a second semiconductor chip 32 follows the first semiconductor chip 31, which emits in particular red or yellow light. The second semiconductor chip 32 generates, for example, blue light. An active zone 33 of the second semiconductor chip 32 is oriented perpendicular to an active zone 33 of the first semiconductor chip 31. Thus, a main emission direction E2 of the second semiconductor chip 32 lies transversely to the first emission direction E1 of the first semiconductor chip 1. Seen in plan view, the active zone 33 of the second semiconductor chip 32 is completely arranged alongside the active zone 33 of the first semiconductor chip 31. In this case, the active zone 33 of the second semiconductor chip 32 is located on a light-transmissive growth substrate 35, which completely covers the first semiconductor chip 31.

Optionally, a mirror 5 is located on a side of the growth substrate 35 of the second semiconductor chip 32 facing the first semiconductor chip 31, said mirror is preferably configured as a Bragg mirror. Preferably, only light of a second color, which is generated in the second semiconductor chip 32, is reflected at the mirror 5. The mirror 5 is transmissive to light of a first color, generated in the first semiconductor chip 31.

Electrical connection surfaces 62 of the second semiconductor chip 32 are located on the side on which the active zone 33 is located, too. The second semiconductor chip 32 is thus designed as a flip-chip. Each of the connection surfaces 62 of the second semiconductor chip 32 is located at exactly one of the segments 23 of the housing 2. Thus, the segments 23 surround the two semiconductor chips 31, 32 in each case in the form of a frame and all around, ignoring the parting line 24.

Figure 1E:
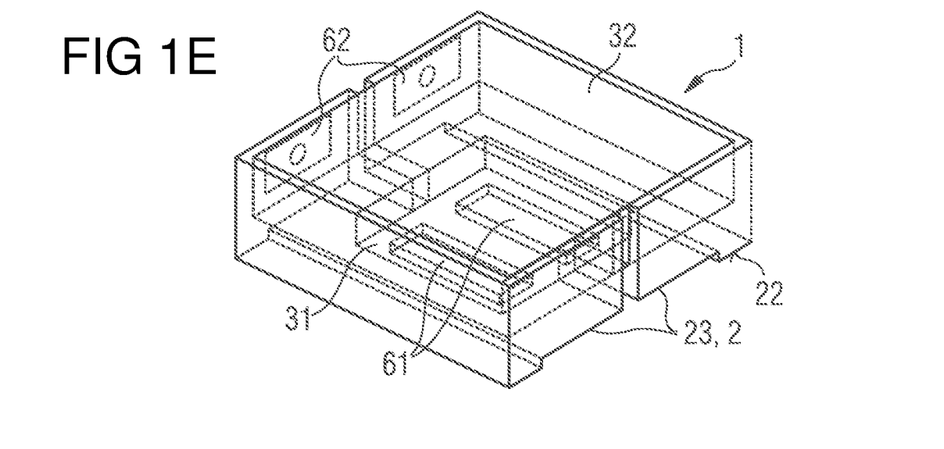
Figure 1F:
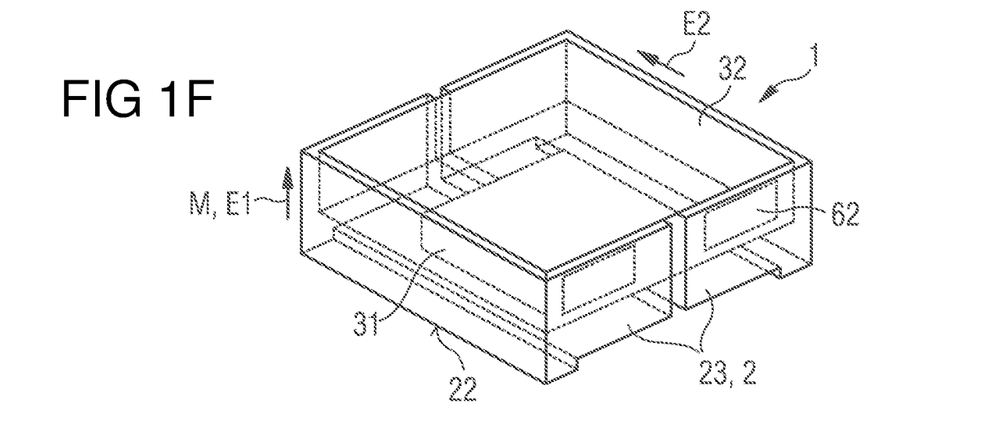
Figure 1G:
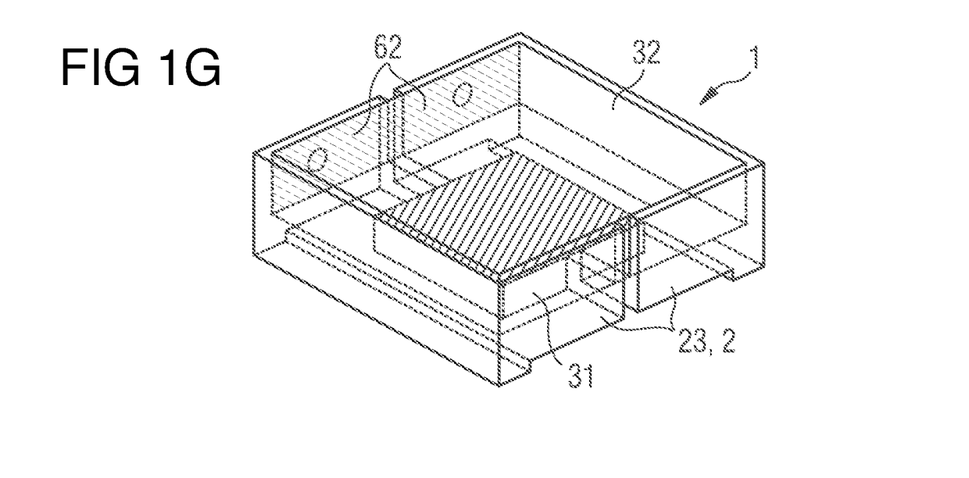

Electrical connection surfaces 61 of the first semiconductor chip 31, see in particular FIG. 1E, all lie on the mounting surface 22. Thus, the first semiconductor chip 31 can be directly electrically contact-connected via the connection surfaces 61 and, in particular, is designed as a so-called flip-chip.

Deviating therefrom, it is possible, as in all other exemplary embodiments, that only one or only some of the contact surfaces form part of the mounting surface 22. For example, one of the contact surfaces, in contrast to the drawing, faces the second semiconductor chip 32 so that the semiconductor chips 31, 32 can be electrically connected in series. This means that the first semiconductor chip 31 does not necessarily have to be a flip-chip in which all contact surfaces lie on a single main side.

In order to simplify the representation, FIG. 1 does not show an optionally present connecting means that in a mechanically fixed manner connects the segments 23 and/or the semiconductor chips 31, 32, in particular in the parting line 24.

Optionally, as in all other exemplary embodiments, a cover 7 can be present, see in particular FIG. 1C. The cover 7 is configured, for example, in the form of a dome-like converging lens.

The second semiconductor chip 32 is in particular a sapphire flip-chip having an unusual aspect ratio. Hence, the growth substrate 35 is made of sapphire and is arranged as illustrated, for example, in FIG. 1A. Thus, the second semiconductor chip 32 has a greater thickness, along the second emission direction E2, than an extent of the second semiconductor chip 32 along the main emission direction M. The second semiconductor chip 32 is singulated, for example, after an epitaxial growth of a semiconductor layer sequence with the active zone 33, by scoring and breaking. The facets formed in this case can be mirror-smooth and serve as the basis for the mirror 5. The active zone 33 of the second semiconductor chip 32 has, for example, a base area between 150 µm and 300 µm×1400 µm inclusive. Along the second emission direction E2, an extent of the growth substrate 35 is, for example, at least 150 µm and/or at most 1000 µm.

All semiconductor chips 31, 32 can thus be electrically contacted without bonding wires. Accordingly, only flip chips are used in the semiconductor component 1. This is not absolutely necessary, and other semiconductor chip designs can also be used accordingly.

Unlike in FIG. 1 and as in all other exemplary embodiments, it is also possible that the growth substrate 35 constitutes only a region close to the active zone 33 and that in remaining regions the growth substrate 35 is substituted by a light-transmissive replacement body, for example, of glass. Alternatively, a light distributor plate, see below, can also be provided for such a replacement body.

Viewed in a plan view, the housing has, for example, a base area of approximately 1.5 mm×1.5 mm=2.25 mm². The chip base surface installed therein, in the present case in particular a surface of the second semiconductor chip 32, is, seen in plan view, for example, approximately 1.5 mm² to 2 mm² and is thus approximately 75% of the base area of the housing 2. Hence, a space-saving light-emitting semiconductor component 1 having a high efficiency as a result of this arrangement of the semiconductor chips 31, 32 is achieved.

Figure 2A:
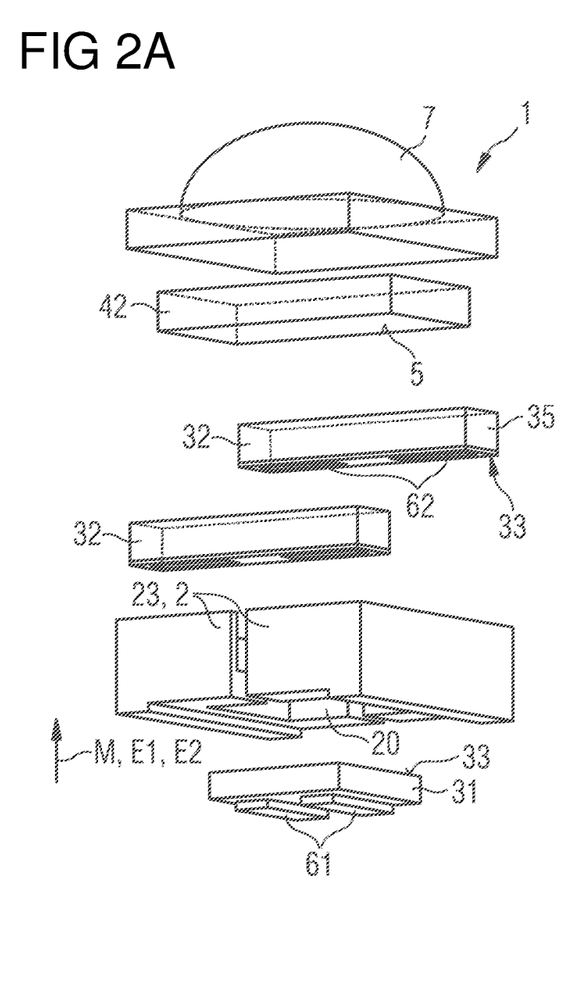
Figure 2B:
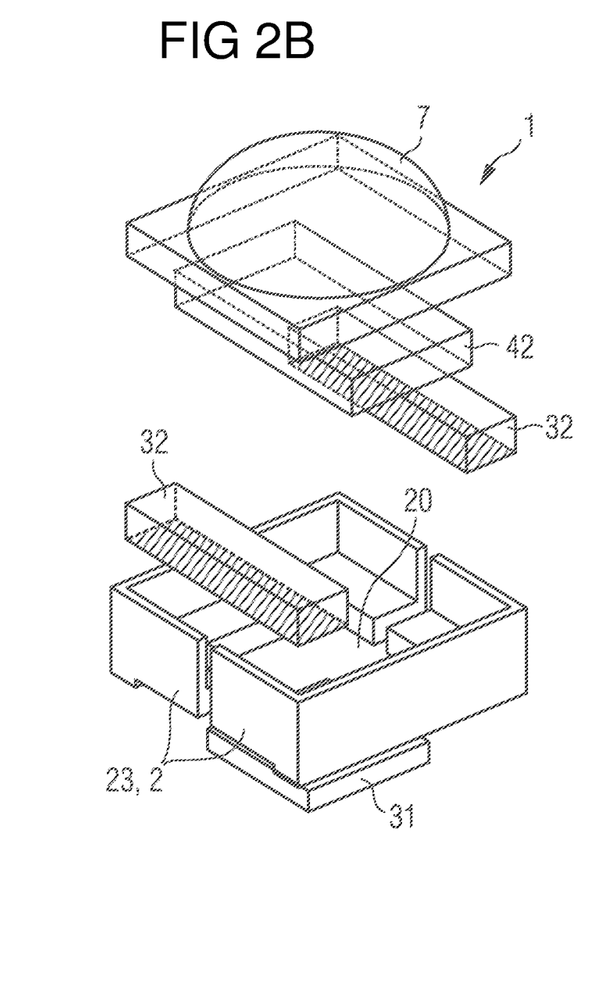
Figure 2C:
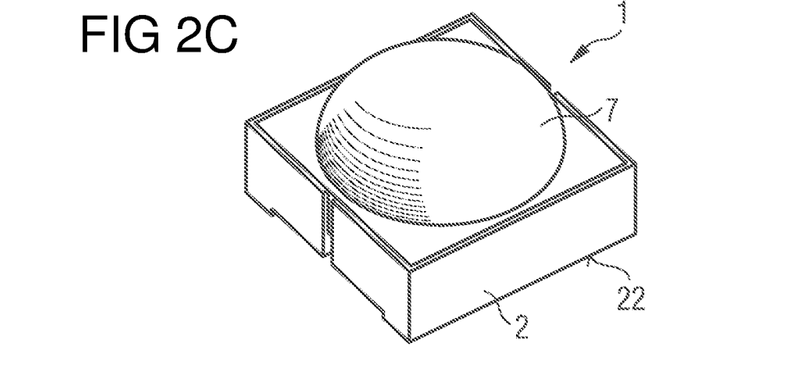
Figure 2D:
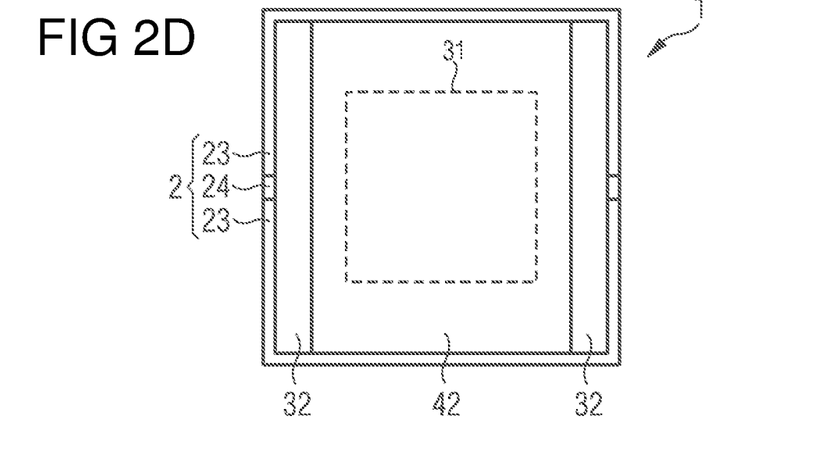

FIG. 2 shows a further exemplary embodiment of the optoelectronic semiconductor component 1, see the exploded drawings in FIGS. 2A and 2B, the perspective representation in FIG. 2C and the top view in FIG. 2D.

In contrast to FIG. 1, two of the second semiconductor chips 32 are present. The second semiconductor chips 32 are of strip-shaped design, wherein longitudinal extents of the second semiconductor chips 32 are oriented perpendicular to longitudinal extents of the segments 23 of the housing 2. Active zones 33 of the second semiconductor chips 32 in each case face the first semiconductor chip 31 and thus the mounting surface 22.

Between the two second semiconductor chips 32, in the direction perpendicular to the main emission direction M, which is aligned parallel to the two emission directions E1, E2 of the semiconductor chips 31, 32, a light distributor plate 42 is located. By means of the light distributor plate 42 a homogeneous radiation mixing of the light from the semiconductor chips 31, 32 is realized so that overall a homogeneous emission takes place.

In this case, the first semiconductor chip 31 can be completely covered by the light distribution plate 42, see FIG. 2D, wherein an air gap can be present between the light distribution plate 42 and the first semiconductor chip 31.

Optionally, the light distribution plate 42 can be provided with a mirror 5 on a side facing the first semiconductor chip 31, analogously to the growth substrate 35 in FIG. 1.

Otherwise, the exemplary embodiment of FIG. 2 corresponds to the exemplary embodiment illustrated in FIG. 1.

Figure 2E:
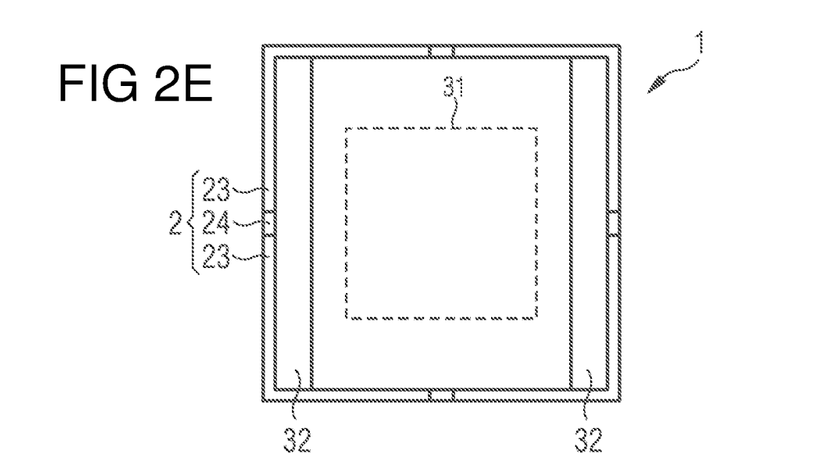

Optionally, see FIG. 2E, it is possible for the housing 2 to be divided into four segments 23. In this case, preferably precisely one of the connection surfaces 62 of the second semiconductor chips 32 rests on each of the segments 23. By such an electrical subdivision of the housing 2, a single, independent control of all semiconductor chips 31, 32 from one another can be achieved. A corresponding modification of the housing 2 can also be present in all other exemplary embodiments. The segments 23 can in each case be of the same size and/or symmetrical with respect to one another.

The metallic housings 2, as illustrated in particular in FIGS. 1 and 2, can also be realized by plastic bodies, produced for instance as MID, for molded interconnect device, or as injection-molded circuit carrier, wherein electrical conductor tracks can be embedded in a plastic material. An alternative embodiment as a lead frame in an injection-molded housing is also possible, as well as a stamped metal conductor frame in a film laminate, ceramic variants such as LTCC, for low temperature cofired ceramics, or low temperature burn-in ceramics, and also designs as QFN, for quad flat no leads package.

In particular, the metal frames, as illustrated in FIGS. 1 and 2, can also be embedded in a panel having a plurality of such semiconductor components 1. The individual semiconductor components 1 can then be contacted, for example, in each case from a rear side, that is, the mounting surface 22. In corresponding arrangements, driving via control units such as microcontrollers is also possible.

Figure 3:
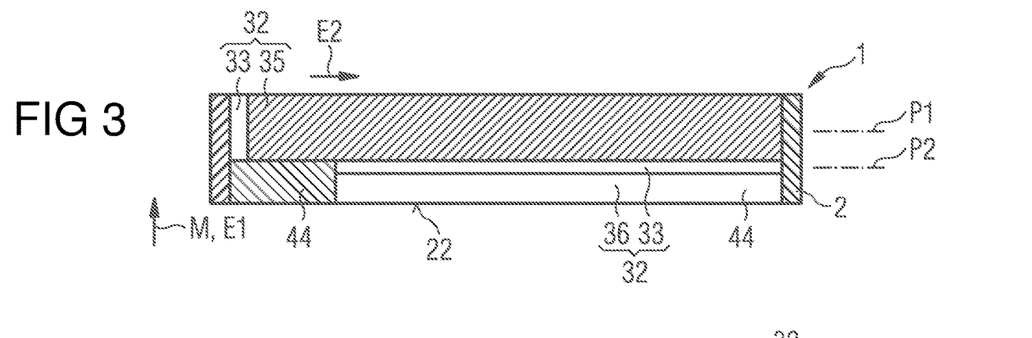
FIGS. 3 to 10 show schematic sectional representations of exemplary embodiments of optoelectronic semiconductor components.

In the exemplary embodiment of FIG. 3, the housing has reflective side walls, for example, made of a metal. The first semiconductor chip 31 is mounted eccentrically on the mounting surface 22, remaining regions of the mounting surface are filled with a reflective casting 44. In the direction parallel to the main emission direction M, the casting 44 preferably terminates flush with the first semiconductor chip 31.

The first semiconductor chip 31 has a support 36 to which the semiconductor layer sequence with the active zone 33 is attached, so that the first semiconductor chip 31 is a surface emitter. The first semiconductor chip 31 is located together with the casting 44 in a first plane P1. The second semiconductor chip 32 is located in a second plane P2. The semiconductor chips 31, 32 do not overlap in any side view.

Figure 4:
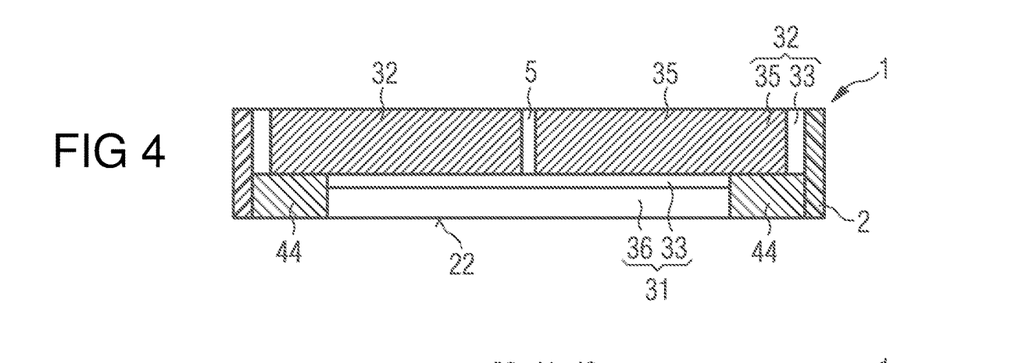

In the exemplary embodiment of FIG. 4, the first semiconductor chip 31 is located centrally on the mounting surface 22. Furthermore, two second semiconductor chips 32 are provided which are separated from one another by the mirror 5, which is arranged centrally and parallel to the main emission direction M. Otherwise, the exemplary embodiment of FIG. 4 corresponds to that of FIG. 3.

Figure 5:
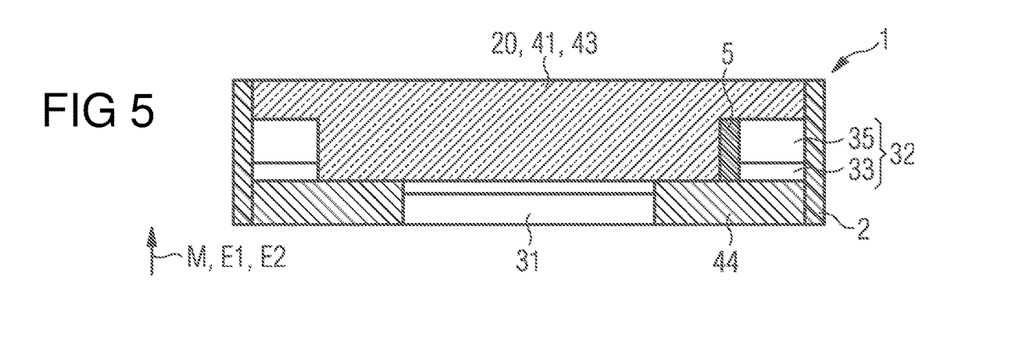

FIG. 5 shows that the recess 20 of the housing 2, in addition to the second semiconductor chips 32 and the first semiconductor chip 31, is filled by a light-transmissive, light-scattering filling 41. Optionally, a phosphor or a phosphor mixture 43 is added to the filling 41.

The filling 41, optionally with the phosphor 43, can project beyond the semiconductor chips 31, 32 in the direction parallel to the main radiation direction M and/or can terminate flush with the housing 2. A uniform light distribution can be realized by means of the filling 41.

The two second semiconductor chips 32 are mounted with the active zone 33 facing the casting 44. Optionally, a mirror 5 can be located on one or on both second semiconductor chips 32, for example, made of a metal, in order to avoid an interaction of the respectively emitted radiation and the active zones 33 of the semiconductor chips 31, 32.

Together with the filling 41 and the casting 44, the housing 2 and thus the semiconductor component 1 are configured as a plane-parallel plate and as an areal light source, as can also be the case in all other exemplary embodiments. Alternatively, analogously to FIG. 1C, a lens-shaped cover 7 is provided.

Figure 6:
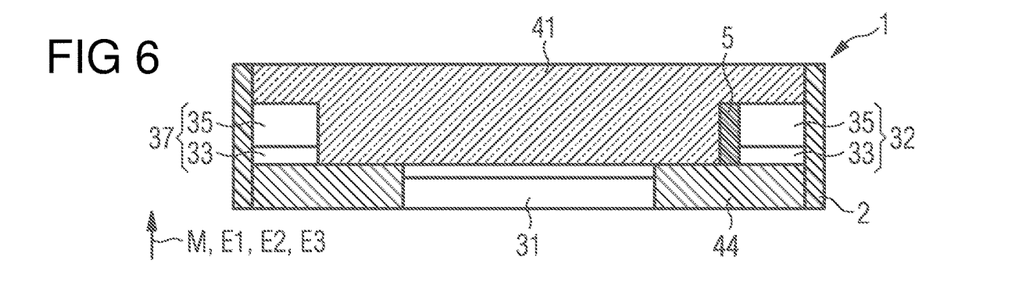

In the exemplary embodiment of FIG. 6, a third semiconductor chip 37 is provided, which emits green light. In addition to the second semiconductor chip 32 emitting blue light and the semiconductor chip 31 emitting red light, an RGB component is thus realized. All emission directions E1, E2, E3 of the semiconductor chips 31, 32, 37 are oriented parallel to the main emission direction M.

Figure 7:
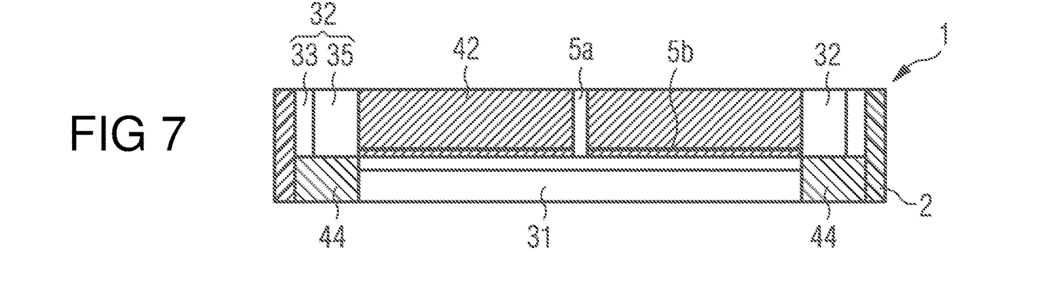

FIG. 7 shows that the substrates 35 of the second semiconductor chips 32 are designed to be comparatively short. Viewed in a plan view, the semiconductor chips 31, 32 thus do not overlap. A region directly above the first semiconductor chip 31 is realized by two light distribution plates 42, between which a first mirror 5a can be mounted in the center. A second mirror 5b, in particular a Bragg mirror, can be located on the sides facing the first semiconductor chip 31. The light distribution plates 42 can be designed in one piece with the respective second semiconductor chip 32 and can thus be fixedly connected to the associated growth substrate 35. The first mirror 5a can be connected to the segments 23 in a mechanically rigid and preferably electrically insulating manner.

Otherwise, the exemplary embodiment of FIG. 7 corresponds to the exemplary embodiment of FIG. 4.

The phosphor or the phosphor mixture 43 can be made of organic or else inorganic phosphors. Quantum dots can also be used as the phosphor. Corresponding phosphors can be present as solid material, for example, as ceramic platelets, or as particles embedded in a matrix material, such as a silicone.

Figure 8:
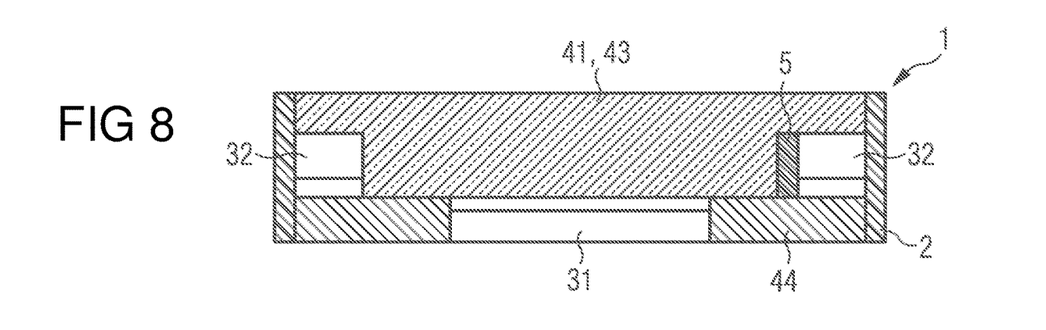

In contrast to the exemplary embodiment of FIG. 6, in the exemplary embodiment of FIG. 8 it is shown that solely second semiconductor chips 32, 37 are present that emit only in the same color. Particularly in this case, the phosphor 43 can be present.

Figure 9:
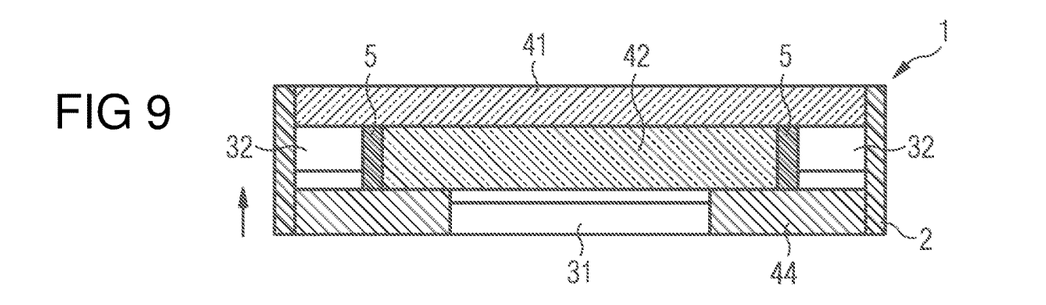

In the exemplary embodiment of FIG. 9, the light distribution plate 42 for the light of the first color of the first semiconductor chip 31 is located between the semiconductor chips 32. Along the main radiation direction M, a likewise optional filling 41 follows the optional light distribution plate 42 over the whole area of the latter, the filling 41 can also cover the semiconductor chips 32.

As in all other exemplary embodiments, the mirrors 5 can be attached directly to side faces of the second semiconductor chips 32, in particular already during the production of the second semiconductor chips 32, so that the mirrors 5 are then not only produced in the recess 20. In other words, it is possible for the mirrors 5 to form an integral component of the second semiconductor chips 32. In particular, at least or only those side faces of the second semiconductor chips 32 are mirrored which face the first semiconductor chip 31. The same can apply to the optionally present third semiconductor chips 37 or to further semiconductor chips.

Figure 10:
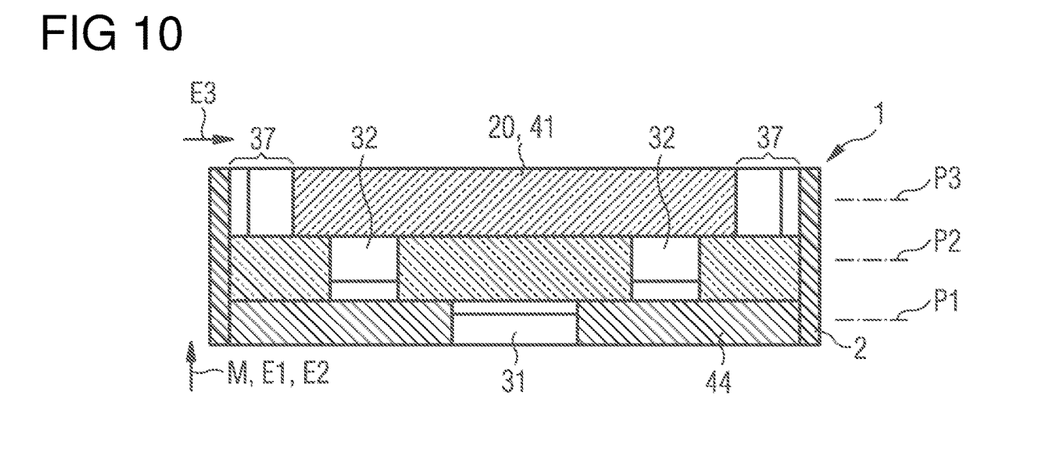

FIG. 10 shows that three planes P1, P2, P3 are present in which the semiconductor chips 31, 32, 37 are arranged. In this case, the recess 20 is designed with two steps on which the semiconductor chips 32, 37 are located.

In contrast to the illustration, both emission directions E1, E2 of the semiconductor chips 32, 37 can also point in the same direction, either parallel to the main emission direction M or also perpendicular to the main emission direction M. It is also possible for more than three types of semiconductor chips 31, 32, 37 to be combined with one another.

With regard to the phosphors 43, the filling 41, the light distribution plate 42 and possible mirror configurations 5, the other exemplary embodiments can be used correspondingly.

In the above exemplary embodiments, in each case only one first semiconductor chip 31 or a plurality of first semiconductor chips 31 are mounted in the recess 20 close to the mounting surface 22, wherein said semiconductor chips 31 each emit light of the same color. In contrast to this, it is also possible for a plurality of semiconductor chips having different emission colors to be mounted in this opening close to the mounting surface 22.

Figure 11:
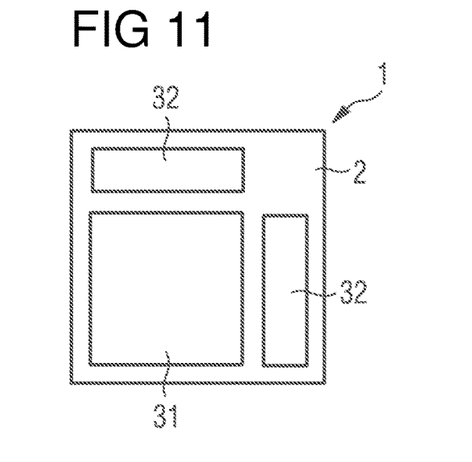
FIGS. 11 to 16 show schematic plan views of exemplary embodiments of optoelectronic semiconductor components.

FIG. 11 shows that the second semiconductor chips 32 are not attached to opposite sides of the first semiconductor chip 31, but are arranged in an L-shaped manner when viewed in a plan view.

Figure 12:
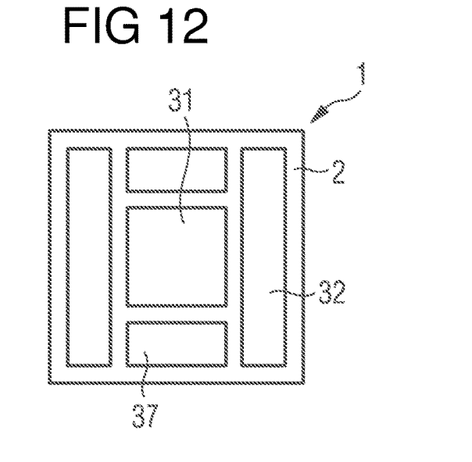

In the exemplary embodiment of FIG. 12, the second semiconductor chips 32 are located on opposite sides of the first semiconductor chip 31, the further semiconductor chips 37 are arranged perpendicularly thereto.

Figure 13:
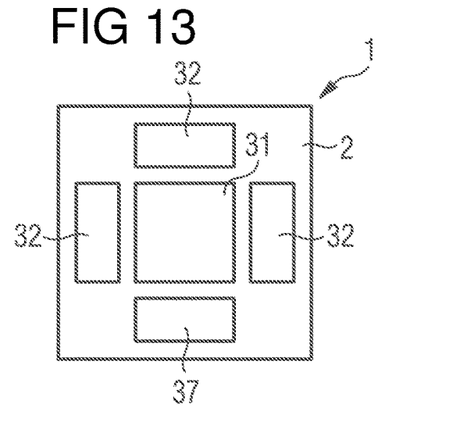

According to FIG. 13, a symmetrical arrangement of the second and further semiconductor chips 32, 37 is present on opposite sides of the first semiconductor chip 31.

Figure 14:
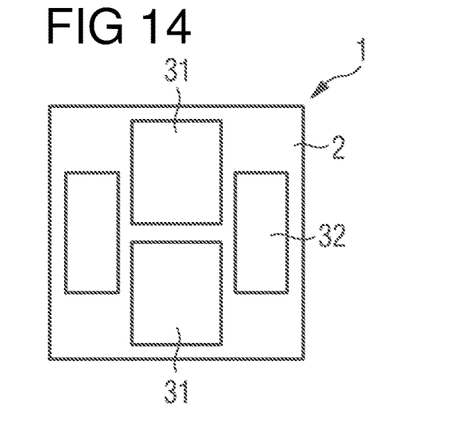

FIG. 14 shows that two first semiconductor chips 31 are present which are located symmetrically and centrally between the second semiconductor chips 32.

Figure 15:
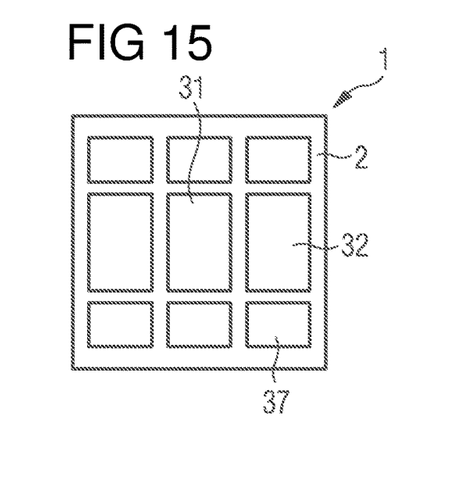

A matrix-like arrangement of the semiconductor chips 31, 32, 37 is also possible, see FIG. 15.

Figure 16:
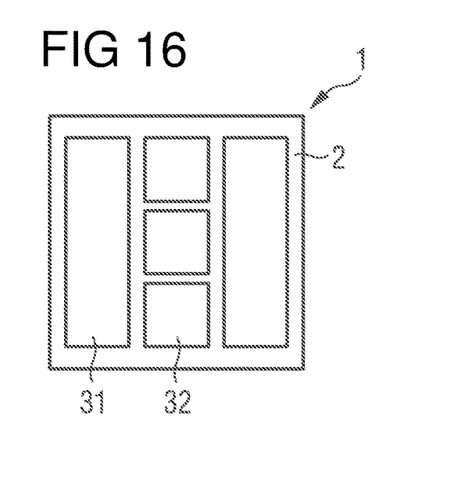

According to FIG. 16, the first semiconductor chips 31 are located at an edge so that the second semiconductor chips 32 are arranged centrally between the first semiconductor chips 31.

The arrangements shown in FIGS. 11 to 16 can in each case be used correspondingly for the exemplary embodiments of FIGS. 1 to 10.

In particular, areal light sources can be realized with the semiconductor components described here, with one or more of the semiconductor components 1. High luminous densities can be achieved by the high proportion of the chip areas on a base area of the semiconductor components 1, for example, for general lighting, for pixels in a display as an individual component or also in a composite in a display.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. An optoelectronic semiconductor component comprising:
    a housing having a recess;
    at least one first semiconductor chip for generating light of a first color; and
    at least one second semiconductor chip for generating light of a second color which is different from the first color,
    wherein, during operation, a mixed radiation comprising at least the light of the first color is emitted along a main emission direction,
    wherein the at least one first semiconductor chip is arranged in a first plane and the at least one second semiconductor chip is arranged in a second plane in the recess, the planes following one another along the main emission direction,
    wherein, seen in plan view parallel to the main emission direction, active zones of the first and second semiconductor chips are arranged side by side to one another,
    wherein the recess, seen in plan view, is filled to at least 20% by the semiconductor chips,
    wherein at least one electrical connection surface of the at least one first semiconductor chip forms a part of a mounting surface of the semiconductor component; and
    wherein a first main emission direction of the first semiconductor chip is oriented parallel and a second main emission direction of the second semiconductor chip is oriented transversely to the main emission direction and the second plane follows the first plane along the main emission direction.

2. The optoelectronic semiconductor component according to claim 1, wherein the optoelectronic semiconductor component comprises a plurality of the first semiconductor chips and a plurality of the second semiconductor chips, and wherein the first semiconductor chips and the second semiconductor chips, viewed in a projection in a direction perpendicular to the main emission direction, do not overlap.

3. The optoelectronic semiconductor component according to claim 1, wherein the optoelectronic semiconductor component comprises a plurality of the second semiconductor chips, and wherein the second semiconductor chips, seen in plan view, are arranged around the first semiconductor chip, and the first semiconductor chip is located centrally in the recess.

4. The optoelectronic semiconductor component according to claim 1, wherein the optoelectronic semiconductor component comprises exactly one first and exactly one second semiconductor chip, and wherein the second semiconductor chip, seen in plan view, completely covers the first semiconductor chip and the first semiconductor chip is located centrally in the recess.

5. The optoelectronic semiconductor component according to claim 1, wherein the at least one second semiconductor chip comprises a light-transmissive growth substrate and at least a part of the light of the first color passes through the growth substrate in the direction parallel to the main emission direction.

6. The optoelectronic semiconductor component according to claim 1, wherein the at least one second semiconductor chip is arranged in the recess so that its active zone faces the first plane.

7. The optoelectronic semiconductor component according to claim 1, wherein the recess is filled with at least one of a light-transmissive, light-scattering filling or a light distribution plate.

8. The optoelectronic semiconductor component according to claim 1, further comprising at least one mirror located in the recess, and wherein the at least one mirror is configured to prevent that light of the second color directly arrives at the active zone of the at least one first semiconductor chip.

9. The optoelectronic semiconductor component according to claim 1, wherein all electrical connection surfaces of the first semiconductor chip form part of the mounting surface of the semiconductor component.

10. The optoelectronic semiconductor component according to claim 1, wherein the housing comprises a reflecting, electrically conductive material, wherein the housing is divided into a plurality of electrically separated segments, and wherein the segments form part of the mounting surface of the semiconductor component and electrical connection surfaces of the second semiconductor chip are electrically connected to the segments within the recess.

11. The optoelectronic semiconductor component according to claim 1, wherein all the first and second semiconductor chips are configured as flip-chips and at least the at least one second semiconductor chip is contact-connected within the recess, and wherein the semiconductor component is surface-mountable.

12. The optoelectronic semiconductor component according to claim 1, wherein the at least one second semiconductor chip has a greater extent in the direction perpendicular to its active zone than in at least one direction parallel to its active zone, and wherein lateral dimensions of the at least one first semiconductor chip are greater than a thickness thereof.

13. The optoelectronic semiconductor component according to claim 1, wherein at least one side surface of the at least one second semiconductor chip forms a reflector.

14. An optoelectronic semiconductor component comprising:

a housing having a recess;

at least one first semiconductor chip for generating light of a first color; and at least one second semiconductor chip for generating light of a second color which is different from the first color, wherein, during operation, a mixed radiation comprising at least the light of the first color is emitted along a main emission direction, wherein the at least one first semiconductor chip is arranged in a first plane and the at least one second semiconductor chip is arranged in a second plane in the recess, the planes following one another along the main emission direction, wherein, seen in plan view parallel to the main emission direction, active zones of the first and second semiconductor chips are arranged side by side to one another, wherein the recess, seen in plan view, is filled to at least 20% by the semiconductor chips, wherein at least one electrical connection surface of the at least one first semiconductor chip forms a part of a mounting surface of the semiconductor component; and wherein the at least one first semiconductor chip is a surface emitter having a Lambertian emission characteristic at only one main side, and wherein the at least one second semiconductor chip is a volume emitter with a light emission on a plurality of sides.

15. An optoelectronic semiconductor component comprising:

a housing having a recess;

at least one first semiconductor chip for generating light of a first color; and at least one second semiconductor chip for generating light of a second color which is different from the first color;

wherein, during operation, a mixed radiation comprising at least the light of the first color is emitted along a main emission direction, wherein the at least one first semiconductor chip is arranged in a first plane and the at least one second semiconductor chip is arranged in a second plane in the recess, the planes following one another along the main emission direction, wherein, seen in plan view parallel to the main emission direction, active zones of the first and second semiconductor chips are arranged side by side to one another, wherein the optoelectronic semiconductor component further comprises at least one of a reflector formed by at least one side surface of the at least one second semiconductor chip, or at least one mirror located in the recess, the mirror in the recess configured to prevent the light of the second color from directly arriving at the active zone of the at least one first semiconductor chip;

wherein the recess, seen in plan view, is filled to at least 20% by the semiconductor chips, and wherein at least one electrical connection surface of the at least one first semiconductor chip forms a part of a mounting surface of the semiconductor component.

* * * * *